United States Patent [19]
Dubroeucq et al.

[11] 4,373,774
[45] Feb. 15, 1983

[54] ILLUMINATOR FOR SUPPLYING A DIVERGENT ILLUMINATING BEAM FROM A PREDETERMINED AREA OF A PLANE

[75] Inventors: Georges Dubroeucq; Michel Lacombat; Michèle Brevignon, all of Paris, France

[73] Assignee: Thomson-CSF, Paris, France

[21] Appl. No.: 142,473

[22] Filed: Apr. 21, 1980

[30] Foreign Application Priority Data

Apr. 23, 1979 [FR] France ............... 79 10209

[51] Int. Cl.³ .................. G02B 27/17; G02B 27/48
[52] U.S. Cl. ............................................. 350/6.6
[58] Field of Search ................ 350/6.1–6.91, 350/285; 250/230, 235; 346/109; 358/206, 208, 285, 293

[56] References Cited

U.S. PATENT DOCUMENTS

| | | | |
|---|---|---|---|
| 3,719,780 | 3/1973 | Gazard et al. | 358/206 |
| 3,771,850 | 11/1973 | Casler | 350/6.91 |
| 3,794,421 | 2/1974 | Kano | 355/45 |
| 3,867,009 | 2/1975 | Pawluczyk | 350/3.67 |
| 3,985,439 | 10/1976 | Kiemle | 355/46 |
| 4,132,479 | 1/1979 | Dubroeucq et al. | 350/162 R |
| 4,155,630 | 5/1979 | Ih | 350/162 R |

FOREIGN PATENT DOCUMENTS

| | | | |
|---|---|---|---|
| 1259952 | 3/1961 | France | 350/6.1 |
| 2104599 | 4/1972 | France | |
| 487318 | 6/1938 | United Kingdom | 350/6.8 |

OTHER PUBLICATIONS

Anderson et al., R. J., *App. Optics*, vol. 10, No. 7, pp. 1605–1608, (Jul. 1971).
Bowman, M. J., "Two New Methods . . . ", *Applied Optics*, vol. 7, No. 11, Nov. 1968, pp. 2280–2284.

*Primary Examiner*—Jon W. Henry
*Attorney, Agent, or Firm*—Oblon, Fisher, Spivak, McClelland & Maier

[57] ABSTRACT

An illuminator for supplying a divergent illuminating beam from an area of predetermined energy distribution and dimensions comprising a coherent source whose image is formed in a plane by imaging means incorporating electrically controlled optical scanning means making it possible to displace the image in the said area in accordance with a predetermined law.

3 Claims, 7 Drawing Figures

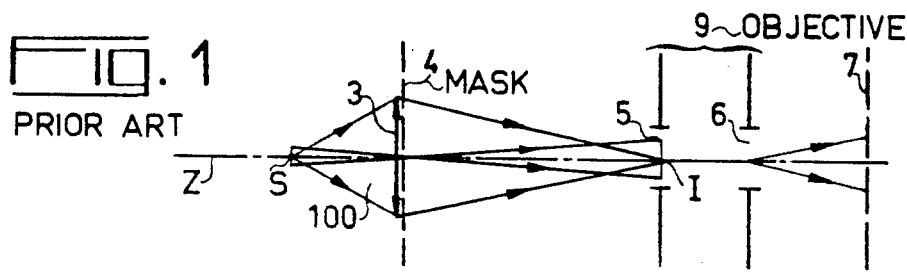
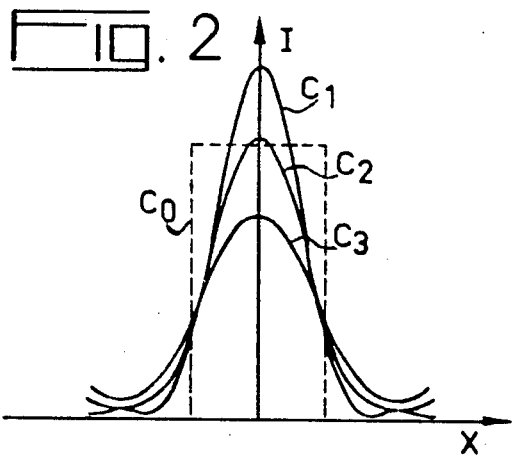
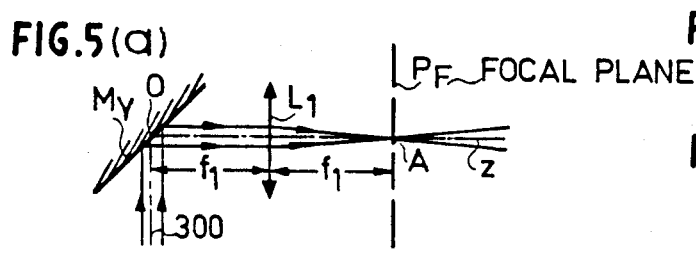
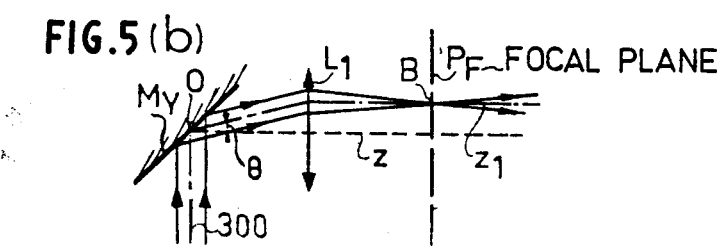
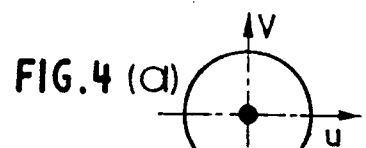
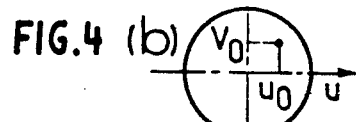
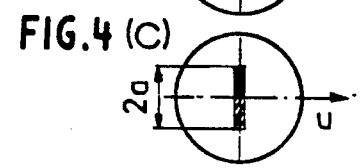
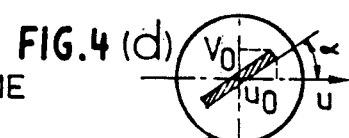
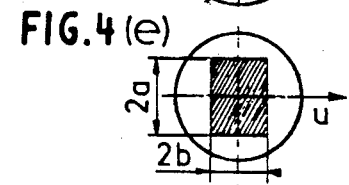
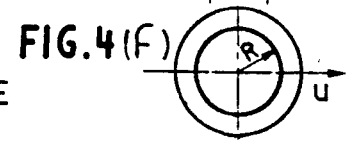
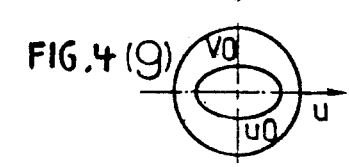

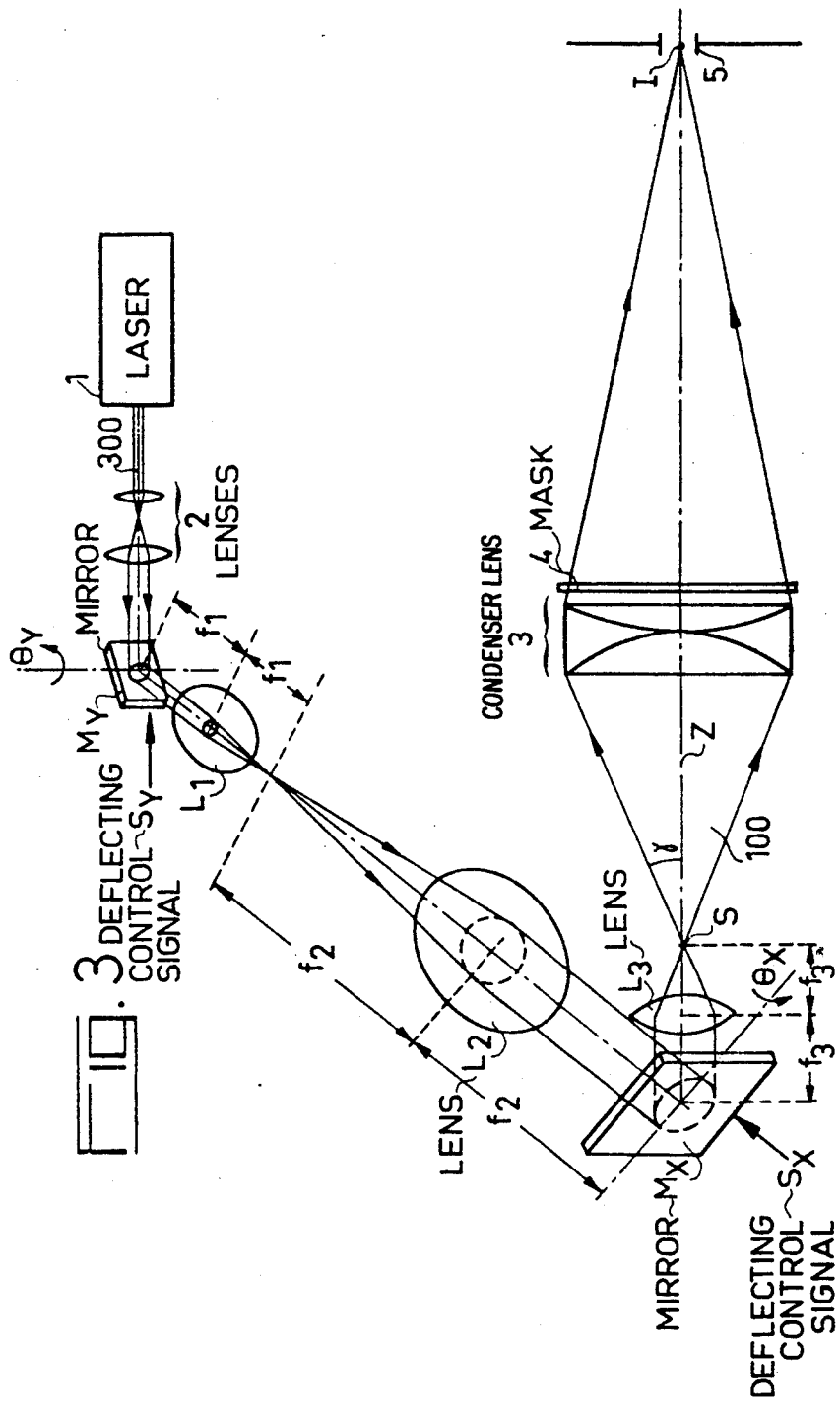

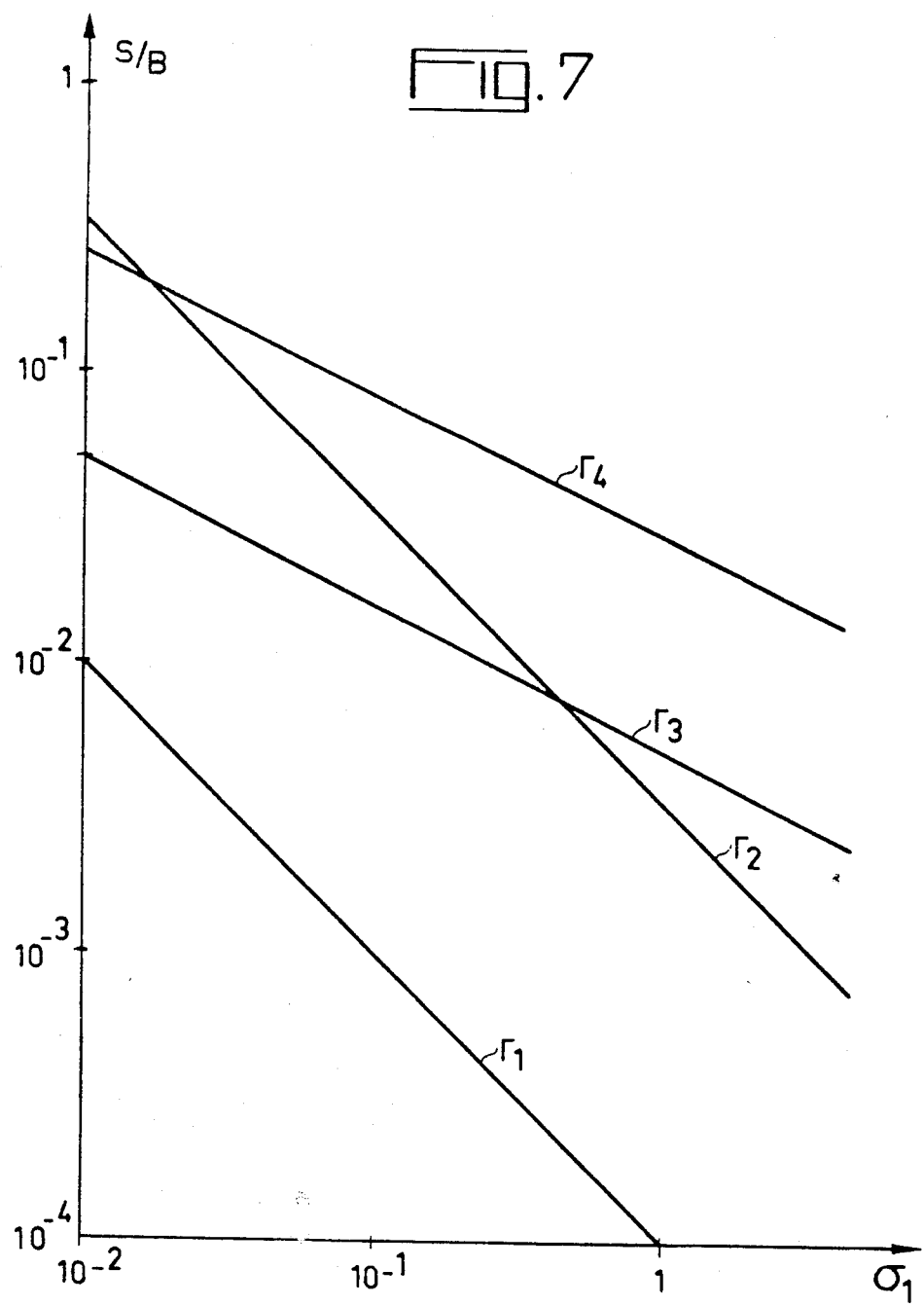

ILLUMINATOR FOR SUPPLYING A DIVERGENT ILLUMINATING BEAM FROM A PREDETERMINED AREA OF A PLANE

BACKGROUND OF THE INVENTION

The present invention relates to an illuminator for supplying a divergent illuminating beam from an area with predetermined energy distribution and dimensions.

The manufacture of integrated circuits involves the superimposing of levels in a semiconductor wafer (e.g. silicon or AsGa). For this purpose, windows are formed on the wafer making it possible to locate the implantation or processing by masking a photosensitive resin deposited on the wafer from a mask. At present, the most frequently used method is transfer by optical projection.

This projection can be carried out at scale 1, the mask being completely projected onto the wafer. It can also be carried out by splitting up the image, either by analysing the mask by a moving slot, or by using the photo-repetition method with a reduction of scale.

In the latter case, during production it is necessary to optimise the production flow rate, more particularly by reducing the exposure time necessary for a good illumination. It is known to bring about a significant reduction in this time by using a laser source.

Due to its spatial and time coherence, the laser constitutes a special illuminating source. Its use in an optical image projection device leads to the appearance of a significant coherence noise. The nature of the illumination must therefore be modified in order to obtain an image with a good signal-to-noise ratio. For this purpose, it is possible to use a device which can average out the interference patterns produced by the coherence of the beam. It is also possible to use a rotary diffuser located in the path of the illuminating beam. The disadvantage of the diffuser is that it introduces a very large luminous energy loss, which partly cancels out the advantages resulting from the high available power of a laser.

BRIEF SUMMARY OF THE INVENTION

The invention proposes a device offering a very good luminous efficiency by creating a source whose degree of coherence can be regulated at random. In more general terms, the invention aims at synthesizing a source having regulatable energy distribution and form, said source being constructed from a laser source and is usable not only in a photorepeater, but in numerous image formation devices where it is desirable to use the advantages of spatial coherence, whilst eliminating the coherence noise.

The invention therefore relates to an illuminator for supplying a divergent illuminating beam from a predetermined area of a plane, wherein it comprises a radiation source and optical means making it possible to form the image of the source in the said plane and in which the said source is coherent and the said optical means incorporate electrically controlled optical scanning means making it possible to move the image in the area in question in accordance with a predetermined law.

BRIEF DESCRIPTION OF THE DRAWINGS

The invention is described in greater detail hereinafter relative to non-limitative embodiments and the attached drawings, wherein show:

FIG. 1 a diagram of an optical system for illuminating an object according to the prior art.

FIG. 2 the intensity distribution of the image of a line by different types of illumination.

FIG. 3 a device according to the invention.

FIG. 4 examples of synthesized sources.

FIG. 5 an explanatory diagram.

FIG. 7 a diagram showing the significance of the invention in connection with the signal-to-noise ratio.

DETAILED DESCRIPTION OF THE PREFERRED EMBODIMENTS

Figure 6:
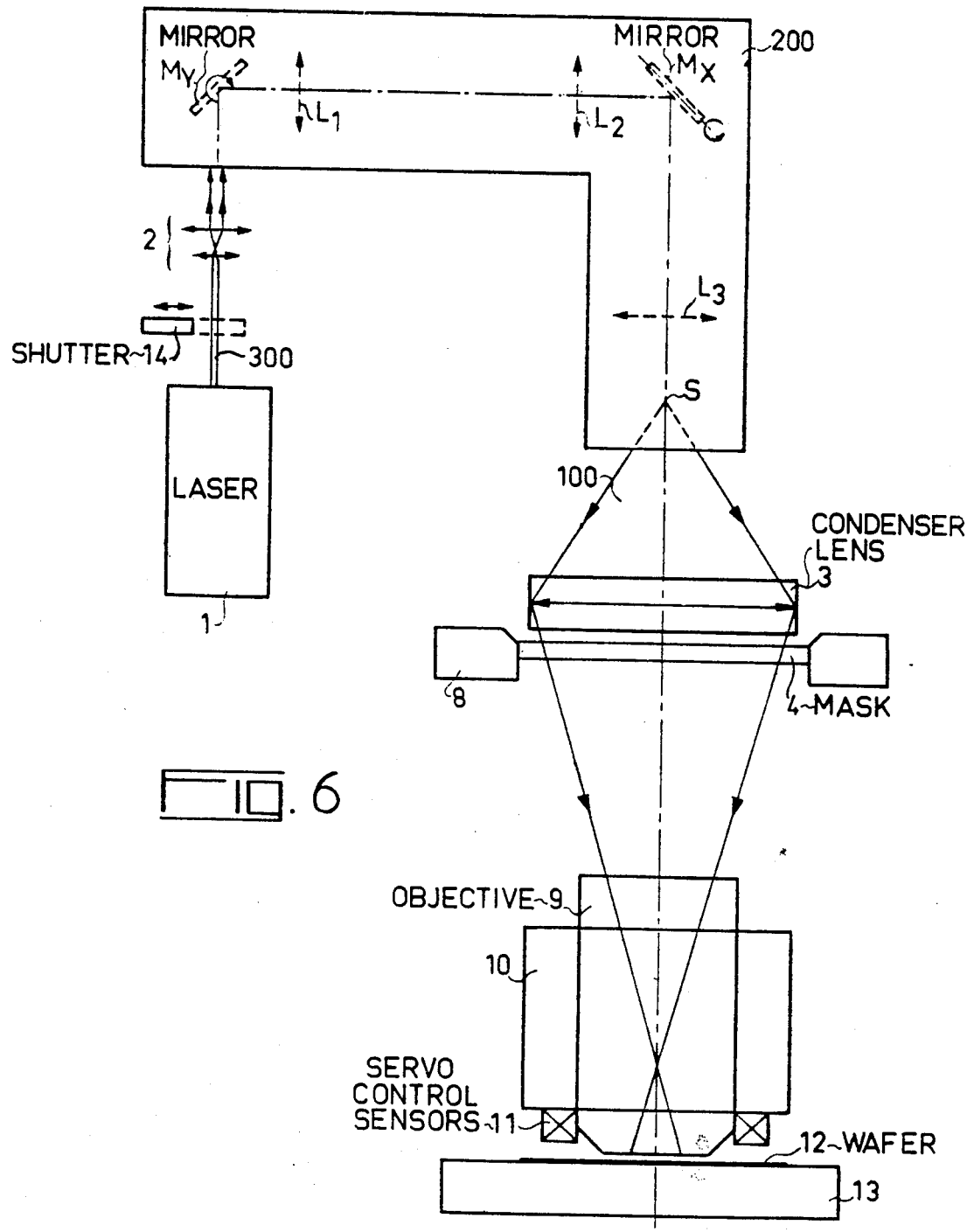
FIG. 6 the application of the invention to a photorepeater.

FIG. 1 is a diagram of an optical system for illuminating an object from a source S, which supplies a luminous beam 100 of axis Z. An object 4, which can be a photographic plate, a mask or any other object formed from transparent areas and opaque areas is illuminated by the beam. In front of the said object is placed a condenser 3 which makes it possible to condense beam 100 towards the entrance pupil 5 of an objective 9. The plane of pupil 5 coincides with the focusing plane of beam 100. The image of object 4 by objective 9 of exit pupil 6 is formed in a plane 7, which can be materialised, as appropriate, by a screen or a photosensitive layer such as a resin deposited on a semiconductor wafer which is to form an integrated circuit. The image formed in plane 7 largely depends on the characteristics of the source S, particularly its spatial coherence or in other words its dimensions. An important parameter, called the degree of partial coherence is the ratio $\sigma$ between the diameter of image I of source S in the plane of pupil 5 and the diameter of said pupil. When source S is a perfectly coherent source, such as a laser, ratio $\sigma$ is substantially zero. In this case, all the illuminated points of object 4 are correlated in phase. In the image plane, the image is reconstituted by interferences between the orders of diffraction all transmitted without attenuation and order zero. When the dimensions of source S increase, the correlation of phase decreases. Certain orders of diffraction are partly blocked by pupil 5, so that the image of the object is not precisely reconstituted. The illumination is completely incoherent, when the dimensions of the source are infinite. Thus, when the dimensions of the source completely cover the pupil 5 ($\sigma=1$), the illumination is already substantially incoherent.

The influence of the source on the image obtained is demonstrated by an example. With the exception of a transparent line, the object is an opaque plate. FIG. 2 is a distribution diagram of the luminous intensity in plane 7 in a direction X perpendicular to the direction of the line for different sources. Curves $C_1$, $C_2$, $C_3$ correspond respectively to $\sigma=0.1$, $\sigma=0.5$, $\sigma=1$. The theoretical image of the line is shown at $C_O$. It is clear that the lower the degree of coherence the higher the intensity collected at the centre of the line and the steeper the slopes of the curve. To obtain image profiles which are of good quality and resolution, it is preferable to have steep slopes.

The advantages of a high spatial coherence on the resolution lead to the use of either an incoherent source behind which is placed a diaphragm, or a laser. The very low energy efficiency obtained with a diaphragm source means that preference is given to the laser. However, the very high time coherence of the latter creates a high and disturbing coherence noise. This can be eliminated by increasing the diameter of the source, which still remains low compared with the diameter of the entrance pupil of the objective.

FIG. 3 shows an illuminator according to the invention, which serves to illuminate an object 4. This illuminator forms the image S of a laser source 1, which is considered as a point source. The parallel beam 300 supplied by laser 1 is widened by a system of lenses 2 and is then reflected by a mirror $M_y$ rotating about an axis $\theta_y$ towards a lens $L_1$ of focal length $f_1$. The beam, which was parallel, thus converges in the focal plane of lens $l_1$. A second lens $L_2$ of focal length $f_2$ is placed behind lens $L_1$ in such a way that its object focal plane coincides with the image focal plane of $L_1$. Thus, on leaving lens $L_2$ there is once again a parallel beam which is reflected by a second mirror $M_x$ which rotates about an axis $\theta_x$. The laser image is formed at S by a third lens $L_3$. When mirrors $M_x$ and $M_y$ are fixed, the synthesized source is a point source and coincides with the focus of lens $L_3$. The directions of rotation axes $\theta_x$ and $\theta_y$ are selected in such a way that the effect of the rotation of mirrors $M_x$ and $M_y$ is a displacement of point S in the image focal plane of lens $L_3$ or in two perpendicular directions. The focal lengths of lenses $L_1$, $L_2$ and $L_3$ are chosen as to obtain the desired apperture $\gamma$ for the beam from source S. Mirrors $M_x$ and $M_y$ are for example galvanometric mirrors controlled respectively by electrical signals $S_x$ and $S_y$. The latter can be fine-wave signals, sawtooth signals or random signals. The rotation amplitudes given to the mirrors determine the displacement amplitudes of point S. The oscillation periods must be small compared with the observation of exposure times provided. For a given time T the form and energy distribution of the synthesized source is defined in the following manner. During time T, point S describes a curve as a function of signals $S_x$ and $S_y$. This curve defines a surface $\Sigma$, which gives the form of the source. Each point of the surface of coordinates u,v has a certain brightness $B_o$, but it is only occupied for a certain time $\sigma t$ by point S. Its energy distribution is written $B(u,v) = B_o \cdot (\sigma t/T)$. With the knowledge of the curve described by point S and its time derivative it is possible to calculate the function $B(u,v)$. It is possible to demonstrate that the source synthesized in this way by scanning surface $\Sigma$ by point S is equivalent to an incoherent source (time incoherence) of the same form and same energy distribution.

Examples of sources which can be synthesized are shown in FIG. 4. At (a), there is a centered coherent source obtained when signals $S_x$ and $S_y$ are zero. At (b) there is an offcentered coherent source obtained when $S_x$ and $S_y$ are non-zero constants $u_o$, $v_o$. At (c) there is a linear source of length $2a$ along axis V, obtained with $S_x = 0$ and $S_y = a \cos \omega t$. In this case, the device need only have a single mirror. At (d) there is a linear source forming an angle $\alpha$ with axis u, obtained with $S_x = u_o \cos \omega t$ and $S_y = v_o \cos \omega t$. At (e) there is a rectangular source of size $2a$ and $2b$ obtained by a television-type scanning with $S_y = b \sin \omega_y t$ and for $S_x$ a periodic signal of high pulsation $\omega_x$ compared with $\omega_y$, for example a sine curve of amplitude a or a sawtooth signal. At (f) there is an annular source of radius $R_o$, obtained with $S_x = R_o \cos \omega t$, and $S_y = R_o \sin \omega t$. At (g), there is an elliptical source obtained with $S_x = u_o \cos \omega t$ and $S_y = v_o \sin \omega t$.

As apparent from FIG. 3, the mirrors $M_x$ and $M_y$ are not arranged in a random manner in the optical path. To prevent aberrations and light losses level with condenser 3, it is preferable that there are not only small displacements of point S relative to the diameter of the condenser, but also that the axis of the following beam on the condenser is always parallel to its optical axis. Thus, the divergent light beam which reaches the condenser is always substantially centered with respect to the latter and there are no light losses. In order to obtain this parallelism, according to the invention, each mirror is positioned in such a way that its rotation axis passes through the focus of the lens which follows it. The optimum case is encountered when the rotation axis is entirely contained within the focal plane, as occurs with mirror $M_y$. Thus, when this mirror pivots, point I describes a straight line in the plane of pupil 5.

FIG. 5 shows the path of incident beam 300 and the beam reflected on mirror $M_y$. At (a) mirror $M_y$ is in a mean position and the axis z of the beam converges in the focal plane PF at A, which is the focus of the lens. At (b), as the mirror has rotated by an angle $\theta/2$ compared with the previous position about an axis perpendicular to the plane of the drawing and passing through the object focus O of lens $L_1$, the axis of the reflected beam forms an angle $\theta$ with the optical axis of lens $L_1$. The beam is still focused in plane PF at point B. A simple optical construction shows that the axis $z_1$ of the beam on the lens is parallel to optical axis z and is spaced from the latter by a value equal to $f_1 \times tg\theta$. The same reasoning can be used for mirror $M_x$ in a perpendicular direction.

In the case of the device shown in FIG. 3, for constructional reasons, this position of the rotation axis has not been respected for mirror $M_x$. When this mirror pivots, point I describes a parabolic axis in the plane of the pupil. However, as the rotation amplitudes still remain low (typically below 0.1 rad) the maximum variations obtained compared with the ideal straight line are very small (relative variation below 4%). Furthermore, the axis of the light beam only remains parallel to the optical axis of the lenses when it passes through the foci thereof, which is the case in FIG. 3. If this is not the case, the axis of the beam remains parallel to a fixed direction which is not parallel to the optical axis.

The invention is applied more particularly to making a pattern carried by a mask on a photosensitive resin by means of a photorepeater. FIG. 6 shows a photorepeater using a device 200 for synthesizing a source S in accordance with the invention. Laser 1 is for example a krypton laser of power 2 W, whose radiation diagram has two very fine lines at 413 and 415 nm. In the path of beam 300, there are successively a fast shutter 14 which is used for determining the necessary illumination time T, then the various elements of FIG. 3 indicated in the same way, namely lenses 2, system 200 constituted by mirrors $M_y$ and $M_x$ and lenses $L_1$, $L_2$ and $L_3$. This system supplies the source S providing the divergent beam 100 illuminating the entire surface of condenser 3. Thus, lens $L_3$ has a large aperture and a small focal length. Behind condenser 3 are provided mask 4 carried by an object mount 8, objective 9 carried by an objective holder 10 and which is provided with sensors 11 ensuring automatic focusing. A semiconductor wafer 12 covered with a photoresist material is placed in the image plane. It is carried by a table 13 which ensures displacement in two perpendicular directions for the repetition of the pattern carried by the mask. The main noise sources in this type of device are:

in the case of noise due to the object the phase noise due to the lack of uniformity in the thickness and possibly the index of refraction of the mask and the impulse noise generating by mask faults, this constituting white noise which is not dependent on the coherence;

in the case of noise due to the projecting objective, the random noise due to diffusion in the glass of the lenses.

In the case of coherent lighting, as the source is substantially a point source and the time coherence is very high, the phase noise and diffusion noise are summated at any point in the image plane in amplitude and in phase. When the scanning according to the invention is used, the diffusion noise is reduced by enlarging the image of the source in the entrance pupil of the objective. The phase noise is reduced by varying the phase of the wave illuminating the mask during the exposure time. In the case of a circular or annular source, as shown at (f) in FIG. 4, the theoretical value of the surface of image I of the source in the entrance pupil of the objective is $\Sigma_o = \pi(1.22\lambda/2 \times ON)^2$ in which $\lambda$ is the wavelength of the light beam and ON the numerical aperture of the objective which is inversely proportional to the diameter of source S. In practice, the true value $\Sigma_1$ of this surface is well above $\Sigma_0$, due to aberrations of the lenses.

FIG. 7 shows variations in the signal-to-noise ratio S/B as a function of the degree of real coherence $\Gamma_1$, i.e. the ratio between the real diameter of image I and the diameter of the pupil. The four curves $\Gamma_1$ to $\Gamma_4$ correspond respectively to a circular source with $\Sigma_1 = \Sigma_0$ and $\Sigma_1 = \Sigma_0 \times 10^{-3}$ and an annular source with $\Sigma_1 = \Sigma_0$ and $\Sigma_1 = \Sigma_0 \times 10^{-3}$. It can be seen that the noise decreases rapidly when the source diameter increases. Taking account of the characteristics of photosensitive resins with $\sigma_1$ of the order of $10^{-1}$ noise no longer has any effect on the impression of the resin and the spatial coherence is still very high, making it possible to retain the advantages in connection with the resolution. Moreover, the high power of the laser units permits very short exposure times.

The invention can be used not only for photorepetition, but also in scale 1 projection systems and catadioptic projection systems.

What is claimed is:

1. A device for synthesizing a light source in a predetermined plane, said light source having a regulatable energy distribution and form and acting as an illuminator, said source supplying a divergent illuminating beam from said plane having a predetermined coherence level, comprising:
   a coherent radiation source producing a coherent beam;
   optical means for controlling the movement of said beam, including electrically controlled optical scanning means for moving the beam in a selected circular pattern so as to change the coherence level and the amount of coherent noise in said beam; and
   wherein said optical means includes two optical scanning mirrors whose pivoting axes have different directions, two lenses positioned between said two optical scanning mirrors, having a common optical axis and a common focus, and a third lens for focusing the beam from said second mirror to a point source which moves according to the movement of said two scanning mirrors said point source having a variable shape and a predetermined distribution of energy levels.

2. A device for synthesizing a light source in a predetermined plane, said light source having a regulatable energy distribution and form and acting as an illuminator, said source supplying a divergent illuminating beam from said plane having a predetermined coherence level, comprising:
   a coherent light source for providing a coherent beam;
   a first lens;
   a second lens;
   wherein said first lens and second lens are coaxial with said coherent beam, said first lens acting to focus said coherent beam and said second lens acting on the focused beam from said first lens to produce a collimated beam larger in diameter than said coherent beam;
   a first reflector for reflecting said collimated beam from said second lens in a direction dependent on the orientation of said first reflector;
   a first deflecting device for changing the orientation of said first reflector in accordance with a first deflecting control signal;
   a third lens for receiving the reflected beam from said first reflector, focusing the same and being a distance from said first reflector, equal to the focal length of said third lens:
   a fourth lens for receiving the focused beam from said third lens and producing a collimated beam therefrom which is larger in diameter than said reflected beam and being a distance from said third lens equal to the sum of the focal lengths of said third and fourth lenses;
   a second reflector for reflecting said collimated beam from said fourth lens in a direction dependent upon the orientation of said second reflector;
   a second deflecting device for changing the orientation of said second reflector in accordance with a second deflecting control signal;
   wherein said first and second reflectors rotate about first and second axes, respectively, and which extend in perpendicular directions;
   a fifth lens for receiving said reflected beam from said second reflector, focusing the same to form said light source and being a distance from said second reflector equal to the focal length of said fifth lens; and
   wherein the movement of said first and second reflectors produces a movement of said light source so that said light source has a variable shape and a predetermined distribution of energy levels and no coherent noise.

3. A device for synthesizing a light source in a predetermined plane, said light source having a regulatable energy distribution and form and acting as an illuminator, said source supplying a divergent illuminating beam from said plane having a predetermined coherence level, comprising:
   a coherent radiation source producing a coherent beam;
   optical means for controlling the movement of said beam, including electrically controlled optical scanning means for moving the beam in a selected ring shaped pattern so as to change the coherence level and the amount of coherent noise in said beam; and
   wherein said optical means includes two optical scanning mirrors whose pivoting axes have different directions, two lenses positioned between said two optical scanning mirrors, having a common optical axis and a common focus, and a third lens for focusing the beam from said second mirror to a point source which moves according to the movement of said two scanning mirrors said point source having a variable shape and a predetermined distribution of energy levels.

* * * * *